(12) United States Patent
Phillips et al.

(10) Patent No.: US 7,096,928 B2
(45) Date of Patent: Aug. 29, 2006

(54) FLEXIBLE LOOP THERMOSYPHON

(75) Inventors: Alfred L. Phillips, Pine Grove, PA (US); Dmitry K. Khrustalev, Lancaster, PA (US); Kevin L. Wert, Halifax, PA (US); Michael J. Wilson, Racine, WI (US); Jonathan P. Wattelet, Gurnee, IL (US); John Broadbent, Mancetter (GB)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 11/210,548

(22) Filed: Aug. 23, 2005

(65) Prior Publication Data

US 2006/0000582 A1  Jan. 5, 2006

Related U.S. Application Data

(63) Continuation of application No. 10/786,431, filed on Feb. 25, 2004, now Pat. No. 7,013,955, which is a continuation-in-part of application No. 10/628,645, filed on Jul. 28, 2003, now Pat. No. 6,804,117.

(51) Int. Cl.
*H05K 7/20* (2006.01)
(52) U.S. Cl. .............................. 165/104.21; 165/104.33
(58) Field of Classification Search .................. 165/41, 165/104.21, 104.26, 104.33, 80.4
See application file for complete search history.

(56) References Cited

U.S. PATENT DOCUMENTS

| | | | |
|---|---|---|---|
| 4,009,382 A * | 2/1977 | Nath ........................... | 362/582 |
| 4,277,949 A | 7/1981 | Longsworth | |
| 4,366,526 A | 12/1982 | Lijoi et al. | |
| 4,449,576 A | 5/1984 | Baum et al. | |
| 4,561,040 A * | 12/1985 | Eastman et al. ............ | 361/699 |
| 4,740,866 A * | 4/1988 | Kajiwara et al. ........... | 361/702 |
| 4,759,403 A * | 7/1988 | Flint et al. ................. | 165/80.4 |
| 4,819,713 A | 4/1989 | Weisman | |
| 4,909,315 A * | 3/1990 | Nelson et al. ............. | 165/80.3 |
| 4,910,642 A * | 3/1990 | Downing .................... | 361/690 |
| 4,931,905 A | 6/1990 | Cirrito et al. | |
| 4,951,740 A * | 8/1990 | Peterson et al. ............ | 165/276 |
| 4,977,444 A * | 12/1990 | Nakajima et al. ........... | 257/714 |
| 5,036,905 A * | 8/1991 | Eninger et al. ............. | 165/41 |
| 5,070,936 A * | 12/1991 | Carroll et al. ............. | 165/80.4 |
| 5,224,016 A | 6/1993 | Weisman et al. | |
| 5,228,502 A | 7/1993 | Chu et al. | |
| 5,283,715 A | 2/1994 | Carlsten et al. | |
| 5,561,453 A | 10/1996 | Shibata et al. | |
| 5,829,516 A | 11/1998 | Lavochkin | |
| 5,884,693 A | 3/1999 | Austin et al. | |
| 5,890,371 A | 4/1999 | Rajasubramanian et al. | |
| 6,055,157 A | 4/2000 | Bartilson | |
| 6,076,595 A | 6/2000 | Austin et al. | |
| 6,388,882 B1 | 5/2002 | Hoover et al. | |
| 6,536,510 B1 | 3/2003 | Khrustalev et al. | |
| 6,621,713 B1 | 9/2003 | Amaike et al. | |
| 6,643,132 B1 | 11/2003 | Faneuf et al. | |
| 6,657,121 B1 | 12/2003 | Garner | |

\* cited by examiner

*Primary Examiner*—Teresa J. Walberg
(74) *Attorney, Agent, or Firm*—Duane Morris LLP

(57) ABSTRACT

A flexible loop thermosyphon is provided having a flexible, hermetic, outer tube and a flexible, non-hermetic, inner tube, positioned concentrically within the outer tube, forming an annulus between the outer tube and inner tube. The annulus acts as a vapor conduit transferring vapor to the loop thermosyphon condenser while the inner tube acts as a condensate conduit returning liquid to the loop thermosyphon evaporator.

18 Claims, 18 Drawing Sheets

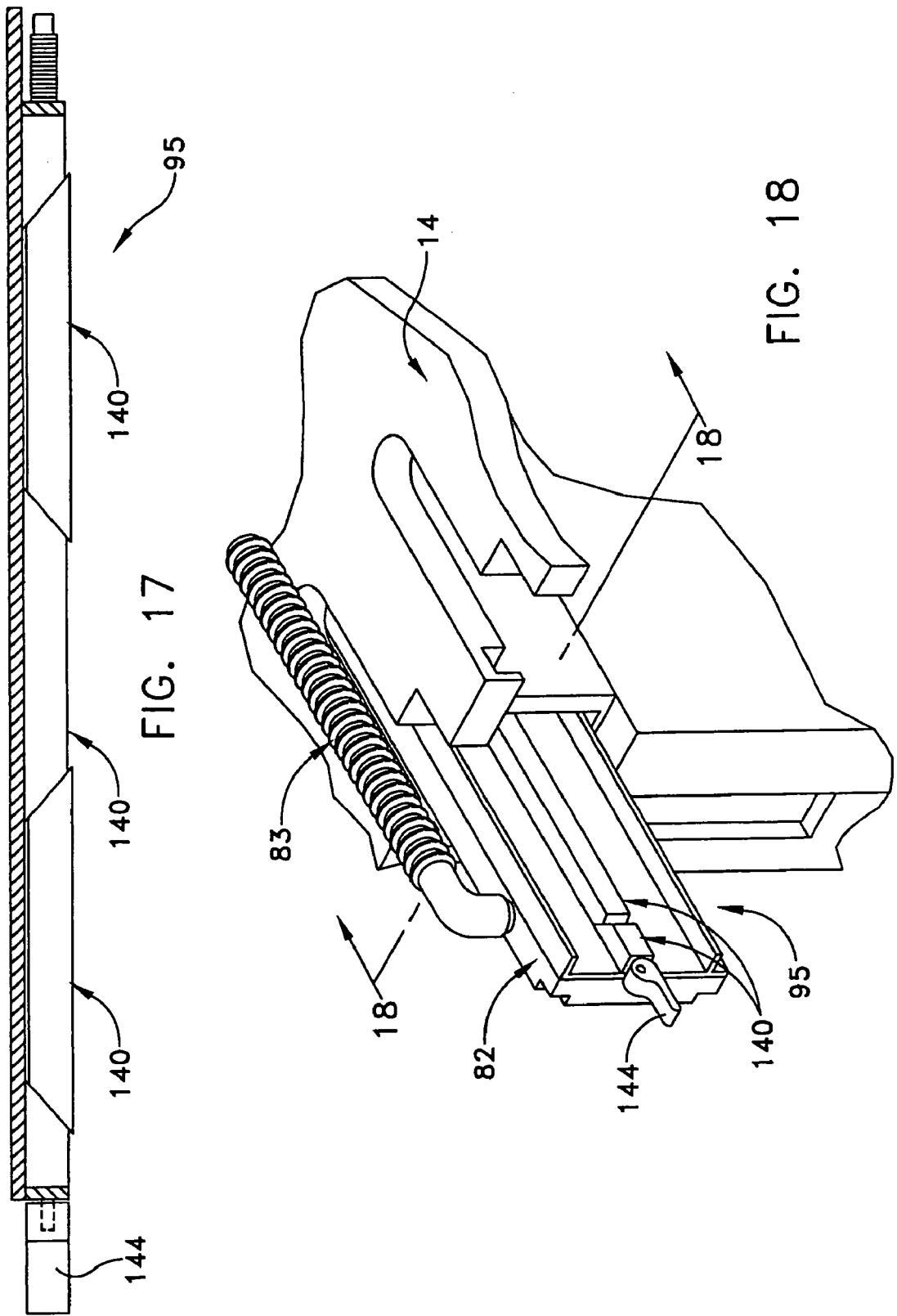

FLEXIBLE LOOP THERMOSYPHON

CROSS-REFERENCE TO RELATED APPLICATIONS

This application is a continuation application of U.S. application Ser. No. 10/786,431, filed on Feb. 25, 2004, now U.S. Pat. No. 7,013,955 which itself is a continuation-in-part of patent application Ser. No. 10/628,645, filed Jul. 28, 2003, and now issued as U.S. Pat. No. 6,804,117.

FIELD OF THE INVENTION

The present invention generally relates to heat management systems for high power electronics equipment, and more particularly to a thermal bus system for a cabinet housing high power, high thermal profile electronic components and systems.

BACKGROUND OF THE INVENTION

In many electronic systems, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical prior art approach to cooling electronic components is to direct a stream of cooling air across the modules and/or circuit cards carrying such devices. However, the increasing power density of electronic systems is reaching the point where it is no longer possible to adequately cool heat generating electronic components by forcing air over them. Power densities are anticipated to reach the point where it is physically impossible to force sufficient ambient temperature air through a cabinet to adequately cool the electronics inside. Several other disadvantages to this approach have also been identified, including: high pressure drop; uniformity of component form factors; placing the components containing the integrated circuits further apart on the circuit cards; increasing the distance between circuit cards; and increasing the volume and velocity of cooling air directed over the components. This required increase in volume and velocity of cooling air requires special considerations in the design of the housings containing the circuit cards and in the mechanical systems for delivering the cooling air. Also, the air quality (moisture content, contamination, etc.) must be tightly controlled to inhibit corrosion, loss of cooling effectiveness, etc. Thus, cooling of components by this means necessitates a number of compromises to the overall system that prevent its use in many systems.

The foregoing thermal management problems have brought about the evolution of other techniques for cooling card-mounted electronic components. For example, one technique includes the use of solid metal thermal mounting cards or plates which conduct the heat dissipated by electronic components to a heat sink (cold plate) disposed at the edge of each circuit card. Such an approach, however, results in a large thermal resistance from the component mounting surface to the heat sink, which causes high component temperatures.

Other known techniques for cooling electronic systems include loop thermosyphons and heat pipes. Loop thermosyphons are devices that use gravity to maintain two-phase fluid circulation during operation. Each loop thermosyphon has an evaporator, where vaporization occurs when it is heated, a vapor conduit through which the vapor flows to a condenser where it is cooled and condenses, and a liquid return conduit to return the liquid to the evaporator. Sometimes a capillary structure is used in the evaporator to reduce its thermal resistance.

A problem is often associated with prior art loop thermosyphons in that leakage occurs at the liquid return line interface with the condenser. This ocurance often results in the need for hermetic sealing at that interface that greatly increases the cost of the device, and often limits the flexibility of the conduits.

SUMMARY OF THE INVENTION

The present invention provides a thermal management system that passively collects waste heat from individual or groups of components and passively transports that heat to a more advantageous location where it can physically be removed by forced air, or to a location inside or outside a cabinet housing the electronic systems, where it can be transferred to an external cooling circuit or sink that may be a significant distance from the electronic system. The thermal management system of the present invention employs heat pipes and other means to collect heat from components on a circuit card and transport that heat to a thermal connector located on a card shell. The thermal management system provides a mating thermal connector which is mounted within a cabinet or chassis, and provides the means to transport heat from the circuit card to a location where it can be removed. The location may be an area within the cabinet where a sufficiently large heat sink can transfer the heat to circulated air, or may be external to the cabinet where heat can be removed by circulating liquid loops or HVAC chiller circuits.

The present invention provides a thermal bus junction arranged within an electronics system for transporting thermal energy in a directed manner from one location to another location by positioning a cold plate, having a portion of at least one heat pipe embedded within a first thermal interface surface of it, adjacent to an evaporator portion of a loop thermosyphon having a second thermal interface surface so that the second thermal interface surface is releasably pressed against the first thermal interface surface. A condenser of a first loop thermosyphon having a first thermal interface surface may also be arranged adjacent to an evaporator portion of a loop thermosyphon having a second thermal interface surface so that the second thermal interface surface is releasably pressed against the first thermal interface surface. Likewise, a cold plate having a portion of at least one heat pipe embedded within a first thermal interface surface and a condenser of a first loop thermosyphon having a second thermal interface surface may be arranged adjacent to an evaporator portion of a second loop thermosyphon having a third thermal interface surface that is releasably pressed against the first and second thermal interface surfaces.

In one embodiment, the present invention provides a flexible loop thermosyphon having a flexible, hermetic, outer tube and a flexible, non-hermetic, inner tube, positioned concentrically within the outer tube, forming an annulus between the outer tube and inner tube. The annulus acts as a vapor conduit transferring vapor to the loop thermosyphon condenser while the inner tube acts as a condensate conduit returning liquid to the loop thermosyphon evaporator. The flexible loop thermosyphon permits relative motion between the evaporator and condenser of the loop thermosyphon by employing a compact coaxial scheme for transport of vapor and condensate. The flexible loop thermosyphon also permits non-hermetic tubing to be used for the condensate conduit and reduces by two the number of hermetic joints required to join the loop thermosyphon evaporator to the condenser.

In another embodiment, an interface is provided for facilitating fluid communication in a flexible loop thermosyphon between the vapor conduit and condensate conduit and the condenser. The condenser comprises a vapor vessel and liquid vessel. The liquid vessel includes a vapor plenum and a liquid header separated by a bulkhead. There is a fitting positioned through the bulkhead. The vapor plenum accepts vapor from the vapor conduit and supplies it to another conduit that serves as a supply line to the vapor vessel. Condensed liquid that collects within the liquid header flows through the fitting to the condensate conduit to return to the loop thermosyphon evaporator.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein:

FIG. 17 is an elevational view of a typical clamping mechanism used in connection with the present invention;

FIG. 18 is a broken-away perspective view of portions of a rack-level cooling assembly and clamping mechanism arranged in accordance with the present invention just prior to full insertion into a rack housing;

DETAILED DESCRIPTION OF THE PREFERRED EMBODIMENT

Figure 1:
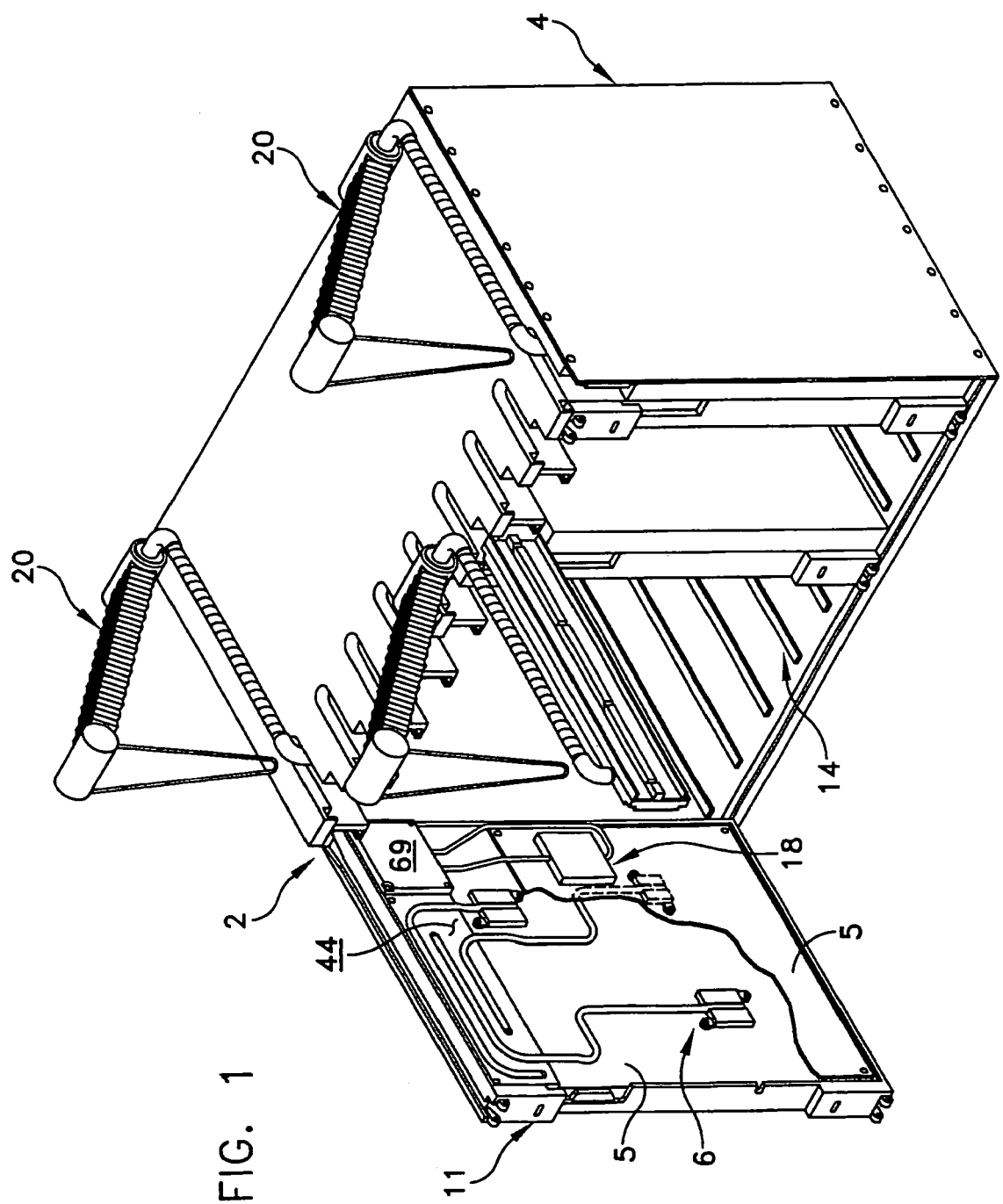
FIG. 1 is an exploded perspective view of a thermal management system formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. Terms such as "busing, buses, or bus" refer to the transport of thermal energy in a directed manner from one location to another location, and the structures related to that transference of thermal energy. In the claims, means-plus-function clauses are intended to cover the structures described, suggested, or rendered obvious by the written description or drawings for performing the recited function, including not only structural equivalents but also equivalent structures.

The present invention provides a thermal management system 2 that may be implemented in a functioning electronic system 4 (e.g., a server, local exchange, or the like) comprising electronic components and/or subsystems of such components that are mounted to printed wiring boards 5. One or more printed wiring boards 5 are often assembled together within a card shell or pack 11 (also referred to in the art as circuit cards, chassis, cases or "packs") that is sized and shaped for mounting within a rack housing 14 (FIG. 1). Card shell 11 is sometimes also used to shield against electromagnetic interference (EMI) as well as to provide protection against physical damage or contamination.

Thermal management system 2 comprises a hierarchical scheme of heat transfer devices that are operatively engaged with individual or groups of heat generating components that form electronics system 4. Of course, as such systems of electronic components and subsystems increase in complexity, and the use of new electronic or optical technologies are incorporated, the number and constituency of such a thermal management scheme will change, all without deviating from the present invention.

Figure 2:
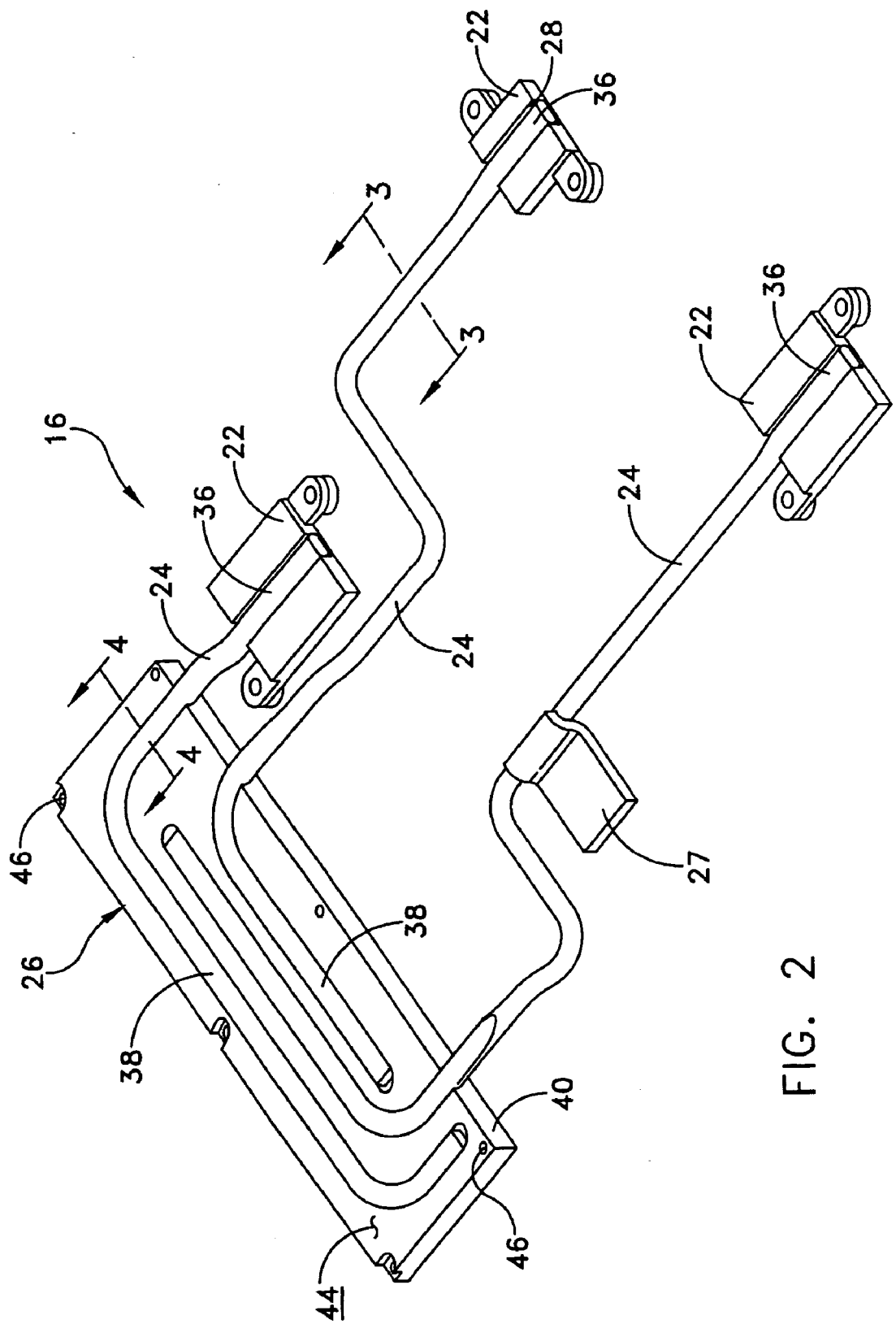
FIG. 2 is a perspective view of a first card-level cooling assembly formed in accordance with the present invention.

Referring to FIGS. 1 and 2, a thermal management system 2 formed in accordance with the present invention comprises a first card-level cooling assembly 16, a second card-level cooling assembly 18, and a rack-level cooling assembly 20. More particularly, first card level cooling assembly 16 comprises one or more thermal saddle heat sinks 22, one or more heat pipes 24, and a thermal connector 26. Each thermal saddle 22 is positioned atop an active, heat generating electronic component, e.g., a processor chip, voltage regulator, power chip, etc. (not shown), to conductively receive operating heat during operation of electronic system 4. A recessed slot 28 is defined in the top surface of each thermal saddle 22 so as to receive an evaporator portion of a heat pipe 24. A heat pipe 24 which cools a large discrete heat source, e.g., a processor chip, can also readily cool additional small heat sources, e.g., I/O modules, voltage regulators, etc., by attaching thermally conductive flags 27 to heat pipe 24 which provide a thermally conductive path. It will be understood that flags 27 may themselves also be heat pipes.

Figure 4:
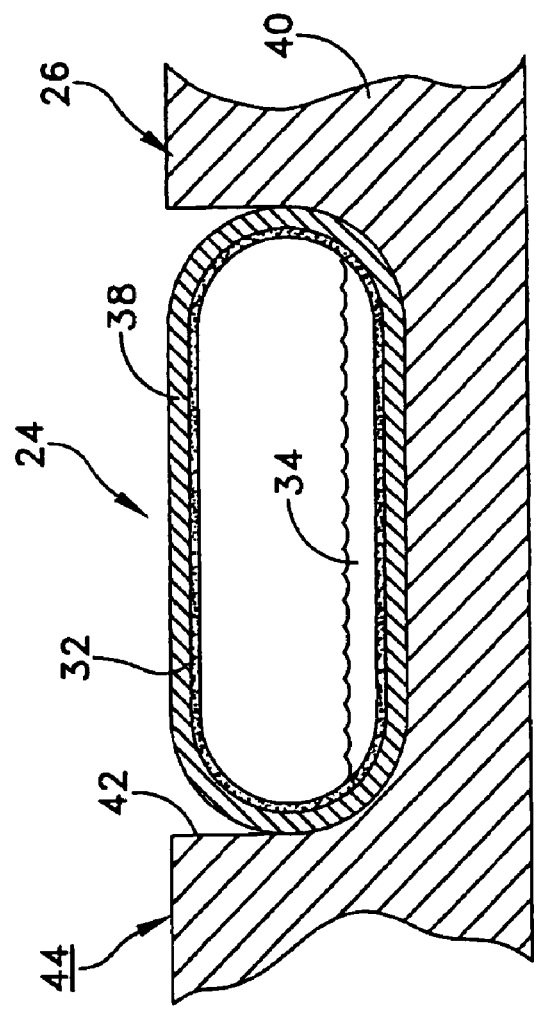
FIG. 4 is a broken-away cross-sectional view of the heat pipe and thermal connector shown in FIG. 2, as taken along lines 4—4 in FIG. 2.
Figure 3:
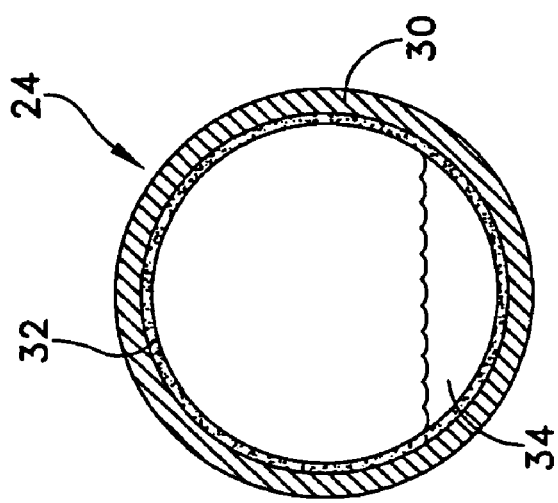
FIG. 3 is a cross-sectional view of the heat pipe shown in FIG. 2, as taken along lines 3—3 in FIG. 2.

Heat pipes 24 comprise a vacuum tight tube 30, a wick 32, and a working fluid 34 (FIGS. 2, 3, and 4). Tube 30 is formed so as to comprise a partially flattened evaporation end 36 and a partially flattened condensation end 38. Tube 30 is often a relatively long, somewhat flattened cylinder formed from a thermally conductive material, that is capable of maintaining a vacuum, e.g., copper, aluminum, or their alloys, monel, silicon stainless steel, silicon carbide, or the like. A vapor space is defined by a central passageway extending along the longitudinal axis of vacuum tight tube 30.

Wick 32 may comprise adjacent layers of screening or a sintered powder structure with interstices between the particles of powder. Working fluid 34 may comprise any of the well known two-phase vaporizable liquids, e.g., water alcohol, freon, etc. Heat pipes 24 are formed according to the invention by drawing a partial vacuum within tube 30, and then back-filling with a small quantity of working fluid 34, e.g., just enough to saturate wick 32, just prior to final sealing of tube 30 by pinching and welding or otherwise hermetically sealing off both ends 36 and 38. The atmosphere inside heat pipe 30 is set by an equilibrium of liquid and vapor generated from working fluid 34.

Figure 7:
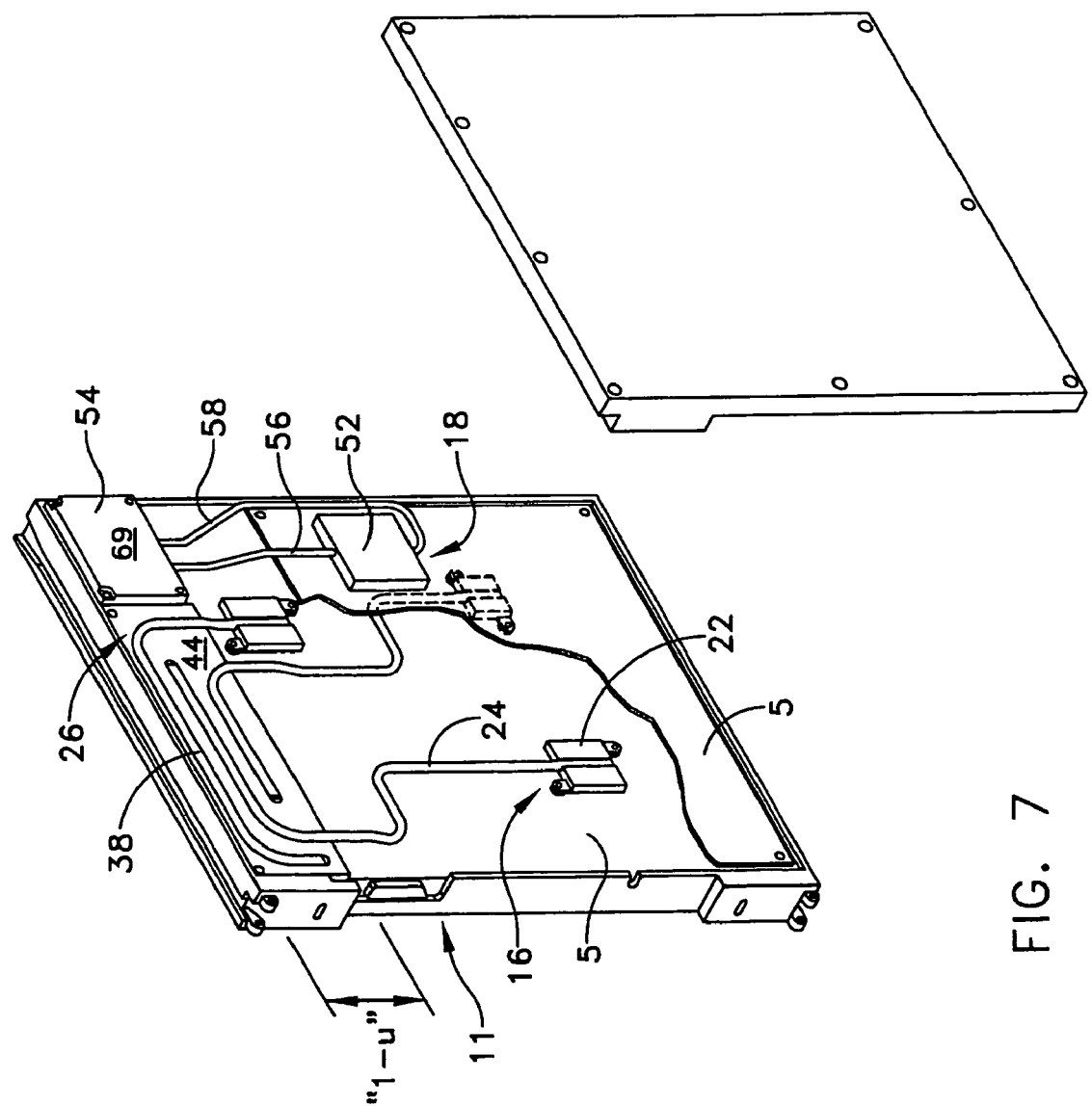
FIG. 7 is an exploded view of a card shell having first and second card-level cooling assemblies engaged with printed circuit boards located within the shell.

Thermal connector 26 comprises an aluminum or copper cold plate 40 that includes one or more channels 42 defined in a first thermal interface surface 44 of thermal management system 2. Cold plate 40 is often sized and shaped so as to be mounted within an edge portion of card shell 11. Thermal connector 26 comprises a first thermal transfer node via thermal transfer interface surface 44, between first card-level cooling assembly 16 and rack-level cooling assembly 20. The length of thermal transfer interface surface 44 may be approximately the width of card shell 11, or somewhat smaller, and the exposed height of thermal transfer interface surface 44 is preferably about one and three-quarter inches, often referred to in the art as "1-U" (FIG. 7). A thermal pad or thermal grease (not shown) may be disposed on thermal transfer interface surface 44 to improve the thermal contact with it. A plurality of mounting holes 46 are defined through cold plate 40, and are sized and shaped to accept conventional fasteners. Preferably, channels 42 are substantially U-shaped, and have a substantially semi-circular bottom portion that is sized and shaped to tightly receive partially flattened condensation ends 38 of heat pipes 24 (FIG. 4). Thermal energy is removed from discrete or clusters of heat generating electronic components through thermal saddles 22, and transported to thermal connector 26 by heat pipes 24 so that heat rejection to the ambient environment, or other heat sinks, may take place outside the vicinity of the circuit card or chassis.

Figure 6:
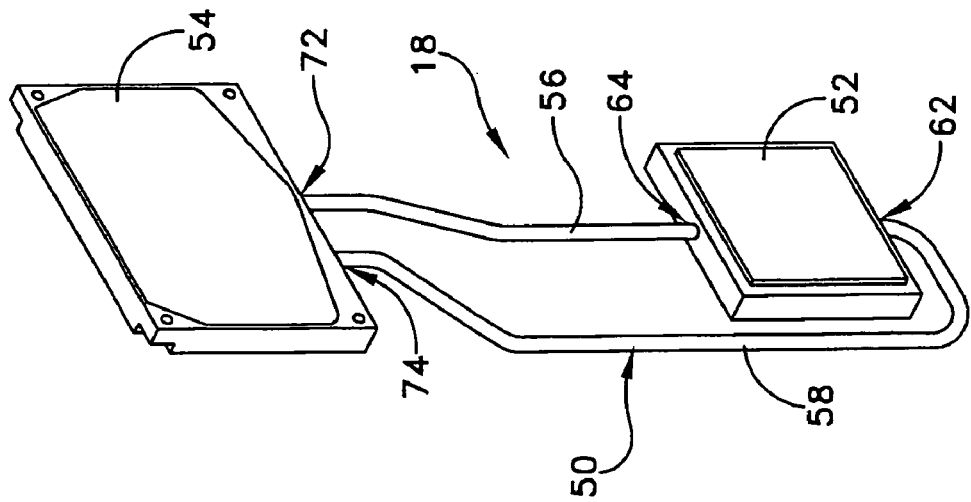
FIG. 6 is rear view of the second card-level cooling assembly shown in FIG. 5.
Figure 5:
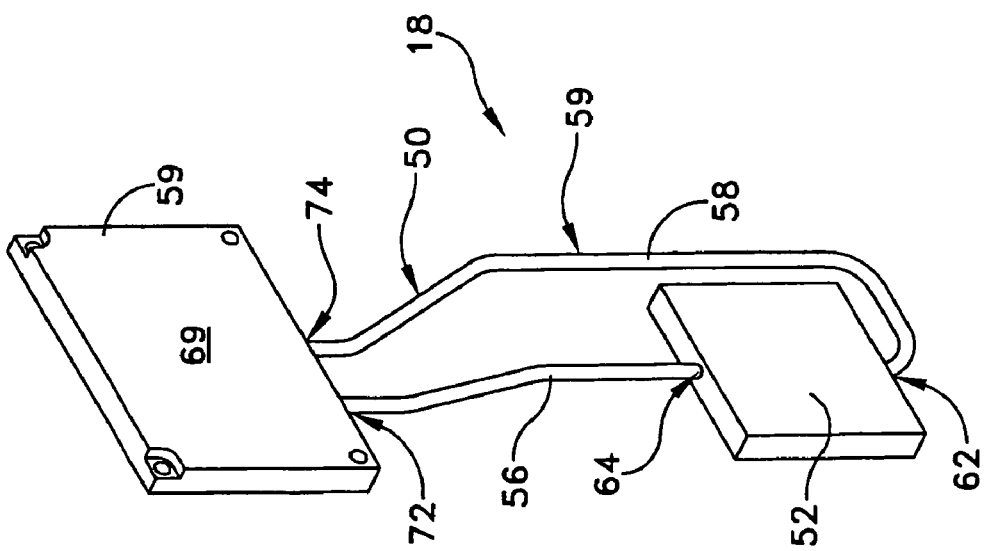
FIG. 5 is a perspective view of a second card-level cooling assembly formed in accordance with the present invention.

Referring to FIGS. 5 and 6, second card-level cooling assembly 18 often comprises a loop thermosyphon 50 that includes an evaporator 52, a condenser 54, a vapor conduit 56, and a condensate conduit 58. One or more loop thermosyphons 50 may be employed for higher power heat sources, since for a given size, loop thermosyphon 50 can transport greater quantities of thermal energy than a heat pipe. Its use also helps to save space on crowded circuit cards. Evaporator 52 comprises, an inlet opening 62, and an outlet opening 64. Inlet opening 62 is arranged in flow communication with condenser 54, via condensate conduit 58, and outlet opening 64 is arranged in flow communication with condenser 54, via vapor conduit 56. Evaporator 52 is arranged in intimate thermal engagement with a source of thermal energy, such as an integrated circuit chip or chips, or an electronic device comprising such chips or other heat generating structures known in the art and located on a printed wiring board 5 within card shell 11. Evaporator 52 may include external and/or internal features and structures to aid in the rapid vaporization of a coolant fluid (not shown). For example, an externally applied thermally conductive coating may used to enhance heat transfer and spreading from the heat source throughout evaporator 52, or a sintered internal surface coating or heat pipe structures may be included in evaporator 52 for the purpose of spreading and transferring heat, generated by the electronic components, evenly throughout evaporator 52.

Loop thermosyphon 50 is charged with a suitable coolant fluid, e.g., water, freon, alcohol, acetone, or some other fluid known in the art for use in heat transfer devices, and which is capable of rapid vaporization and condensation within a closed loop environment. Parameters to be considered when selecting a suitable coolant fluid include the amount of pressure that can be safely applied to evaporator 52, the operating temperature of the equipment to be cooled, the rate of heat transfer, the temperatures reached within evaporator 52, the viscosity of coolant fluid, and the boiling point of coolant fluid. Loop thermosyphon 50 is sealed to the ambient atmosphere so as to form a closed loop system.

Evaporator 52 acts as a heat exchanger transferring the heat given off by one or a cluster of electronic components to the coolant fluid. As the coolant fluid is heated, the pressure within evaporator 52 increases, vaporizing the coolant fluid. The vapor flows through vapor conduit 56, toward condenser 54. Evaporator 52 may comprise many known structures that are suitable for transferring thermal energy to the coolant fluid. Some types of evaporators that have been found to be useful when used in connection with this invention include, tube evaporators, rising film evaporators, falling film evaporators, plate evaporators, and layered wick evaporators. For example, in one embodiment of the invention, evaporator 52 comprises a layered wick evaporator, having a wick formed on its interior surface.

Vapor conduit 56 and condensate conduit 58 may have a conventional structure that is capable of transferring coolant fluid between evaporator 52 and condenser 54. For example, vapor conduit 56 and condensate conduit 58 may be separate structures (e.g., tubes or pipes), or may be formed from a single structure, e.g., multiple channels that are molded or cut into single or multiple blocks. Vapor conduit 56 and condensate conduit 58 may incorporate flexible sections 59 that permit the conduits to be folded for shipment, and to be bent and reconfigured during installation. The length of each flexible section 59 is determined by the needs of the specific application.

Condenser 54 typically comprises a closed container formed from a thermally conductive material, and defines a second thermal interface surface 69 on an outer side surface. Thermal transfer interface surface 69 comprises a second thermal transfer node between second card-level cooling assembly 18 and rack-level cooling assembly 20. The length of second thermal transfer interface surface 69 is often equal to the difference in length between first thermal transfer interface surface 44 and the width of card shell 11. The exposed height of second thermal interface surface 69 is preferably about one and three-quarter inches (FIG. 7). A thermal pad or thermal grease (not shown) may be disposed in the interface area to improve thermal contact. An inlet opening 72 and an outlet opening 74 are defined in edge portions of condenser 54. Inlet opening 72 is arranged in flow communication with evaporator 52, via vapor conduit 56, and outlet opening 74 is arranged in flow communication with evaporator 52, via condensate conduit 58. Condenser 54 acts as a heat exchanger transferring heat contained in a mixture of vaporous coolant fluid and liquid coolant fluid to rack-level cooling assembly 20.

Referring to FIGS. 1 and 8–16, rack-level cooling assembly 20 also comprises a plurality of modular loop thermosyphons 80 that each include, an evaporator 82, a coaxial coolant conduit 83, and a condenser 84. Thermal transport at the rack or cabinet level is typically provided by a loop thermosyphon-type heat exchanger because of its greater transport capacity. However, conventional thermosyphons, heat pipes or loop heat pipes may be used as the application dictates. Evaporator 82 comprises a third thermal transfer interface surface 90 and an inlet/outlet opening 94. Third thermal transfer interface surface 90 forms a thermal energy receptacle that is arranged to receive thermal energy from first card-level assembly 16, via thermal connector 26, and from second card-level assembly 18, via condenser 54. The length of third thermal transfer interface surface 90 is determined by the total width of card shell 11 (FIG. 7). The height of third thermal transfer interface surface 90 is preferably about one and three-quarter inches. Very often, third thermal transfer interface surface 90 is sized and shaped so as to be complementary to the combined size and shape of first thermal transfer interface surface 44 and second thermal transfer interface surface 69. Inlet/outlet opening 94 is arranged in flow communication with condenser 84, via coaxial coolant conduit 83. Evaporator 82 may also include external and/or internal features and structures to aid in the rapid vaporization of a coolant fluid (not shown) such as an externally applied thermally conductive coating to enhance heat transfer, or a sintered internal surface coating or heat pipe structures for spreading and transferring heat evenly throughout evaporator 82.

Figure 11:
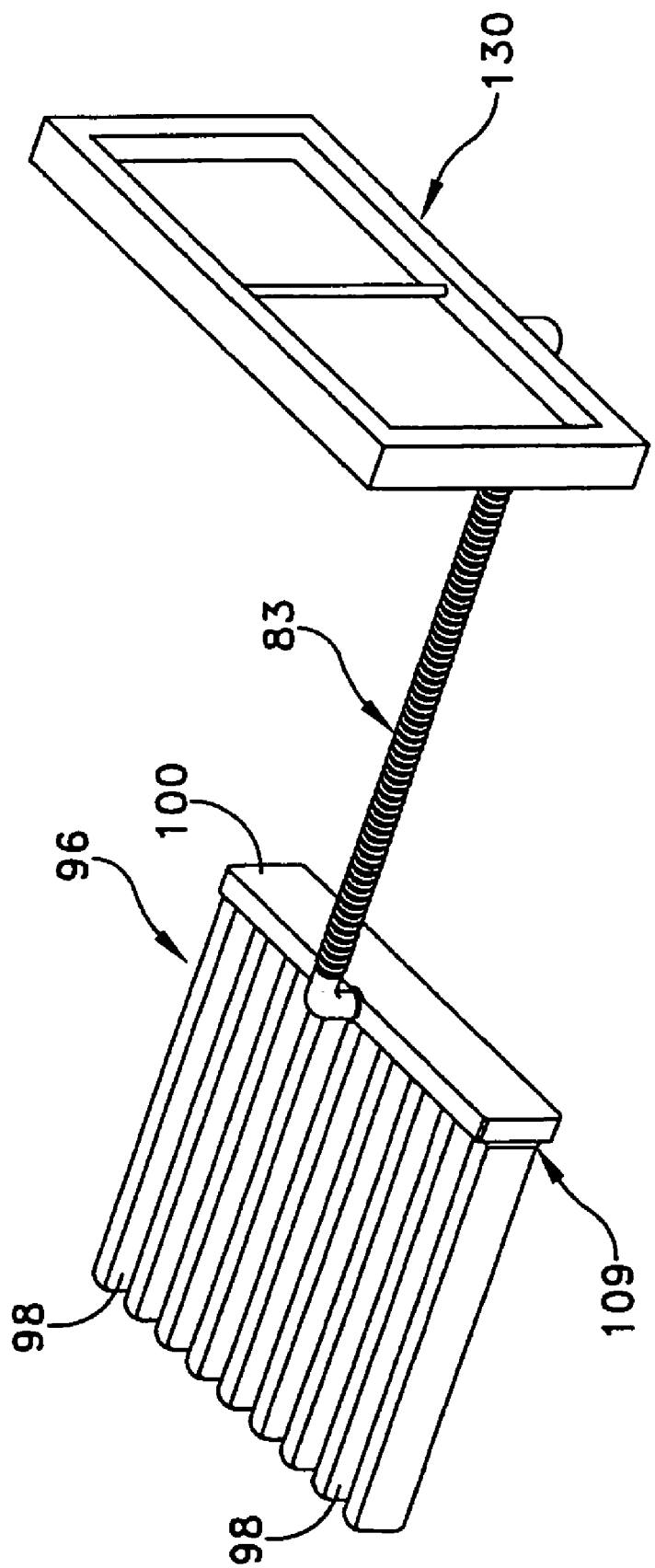
FIG. 11 is a perspective view of one embodiment of evaporator blade and liquid cooled heat exchanger formed in accordance with the present invention.

In one alternative embodiment, a multiple card evaporator 96 includes a plurality of blade-evaporators 98 that extend from a common manifold 100 that is arranged in fluid communication with each blade-evaporator 98. In this embodiment, a single loop thermosyphon serves all the cards in a chassis or rack housing 14. Plurality of blade-evaporators 98 are often arranged in substantially perpendicular relation to common manifold 100, but are otherwise substantially similar to evaporator 82 in structure, components, and function. In this way, multiple card evaporator 96 provides one evaporator blade for each card shell 11 that can fit in rack housing 14. Each blade-evaporator 98 may contain a wick disposed on its interior surfaces. Blade-evaporators 98 of multiple card evaporator 96 are joined into common header manifold 100 so vapor exits the evaporators and condensate returns to common header manifold 100 via coaxial coolant conduit 83 (FIG. 11). Each individual blade-evaporator 98 has the same interface geometry as evaporator 82. Although shown in the figures as a rigid extension of common header manifold 100, the blade/manifold interface 109 may employ flexible joint connections.

Loop thermosyphon 80 is also charged with a suitable coolant fluid, e.g., water, freon, alcohol, acetone, or some other fluid known in the art for use in heat transfer devices, and which is capable of rapid vaporization and condensation within a closed loop environment. Loop thermosyphon 80 is hermetically sealed from the ambient atmosphere so as to form a closed loop system. As coolant fluid is heated, the pressure within evaporator 82 increases, vaporizing the saturated fluid. The vapor flows through coaxial coolant conduit 83, toward condenser 84. Advantageously, the structure of coaxial coolant conduit 83 prevents leakage at the interface between a liquid return conduit and its associated condenser from being an issue during operation of the system. Evaporator 82 may comprise many known structures that are suitable for transferring thermal energy to the coolant fluid. Some types of evaporators that have been found to be useful when used in connection with this invention include, tube evaporators, rising film evaporators, falling film evaporators, plate evaporators, and layered wick evaporators.

Figure 8:
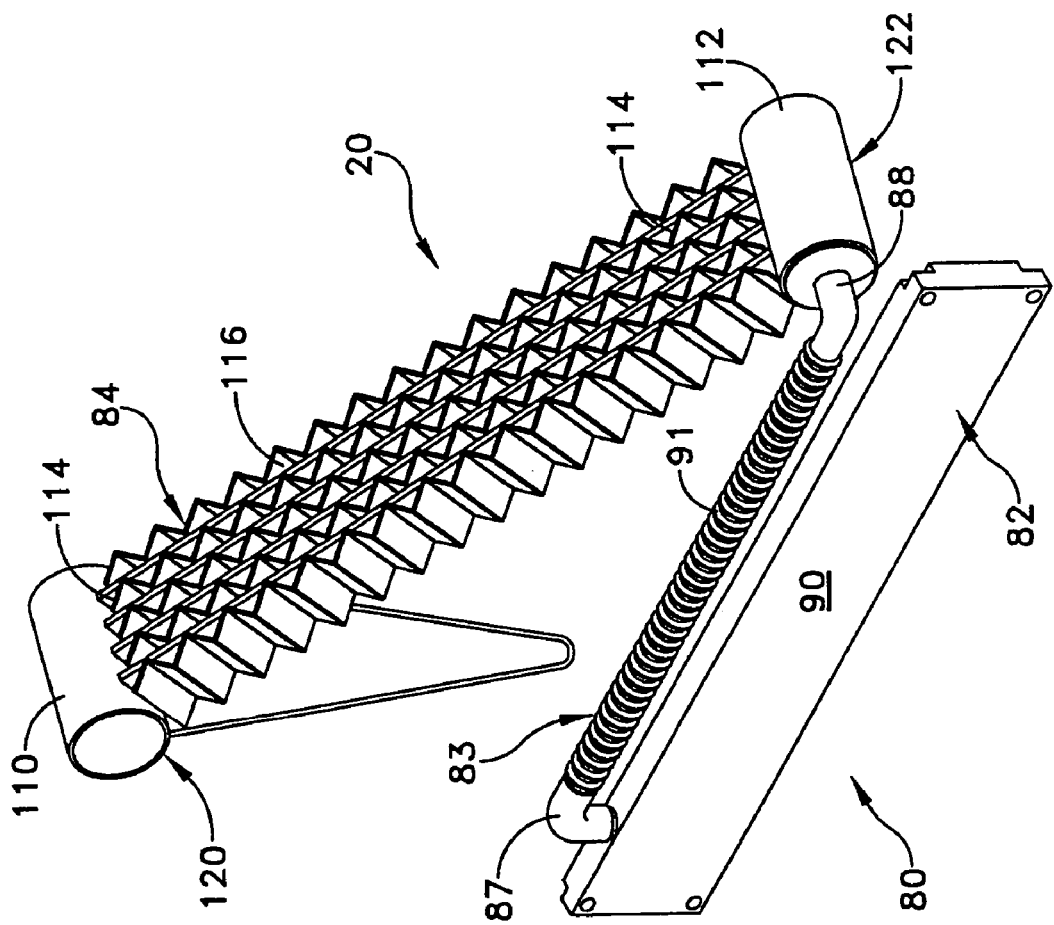
FIG. 8 is a perspective view of a rack-level cooling assembly formed in accordance with the present invention.
Figure 9:
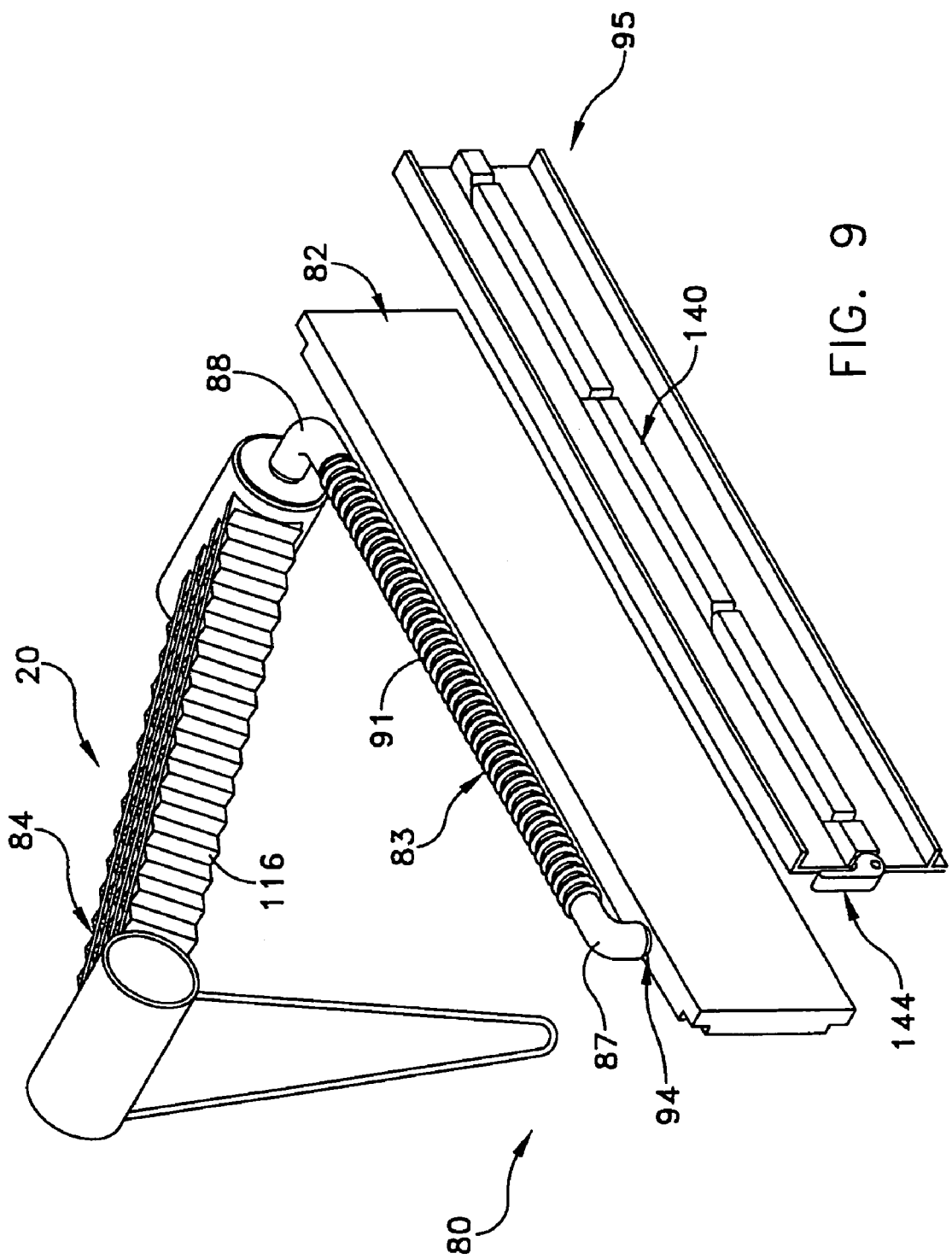
FIG. 9 is a perspective rear view of the rack-level cooling assembly shown in FIG. 8, and having a portion of a clamping assembly exploded away for clarity of illustration.
Figure 12:
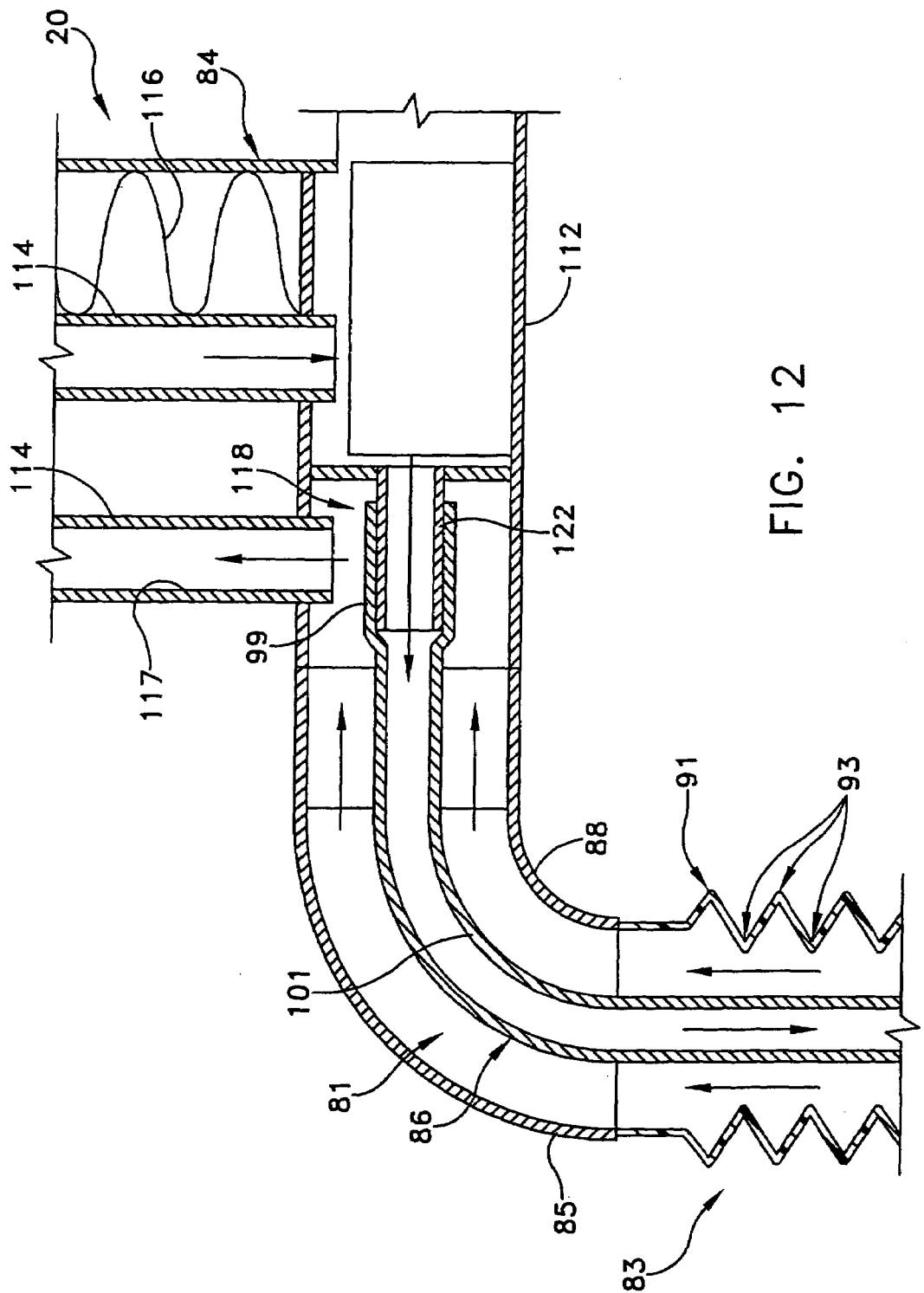
FIG. 12 is a is a broken-away cross-sectional view of an interface between a coaxial transport conduit formed in accordance with an embodiment of the invention and a condenser.
Figure 13:
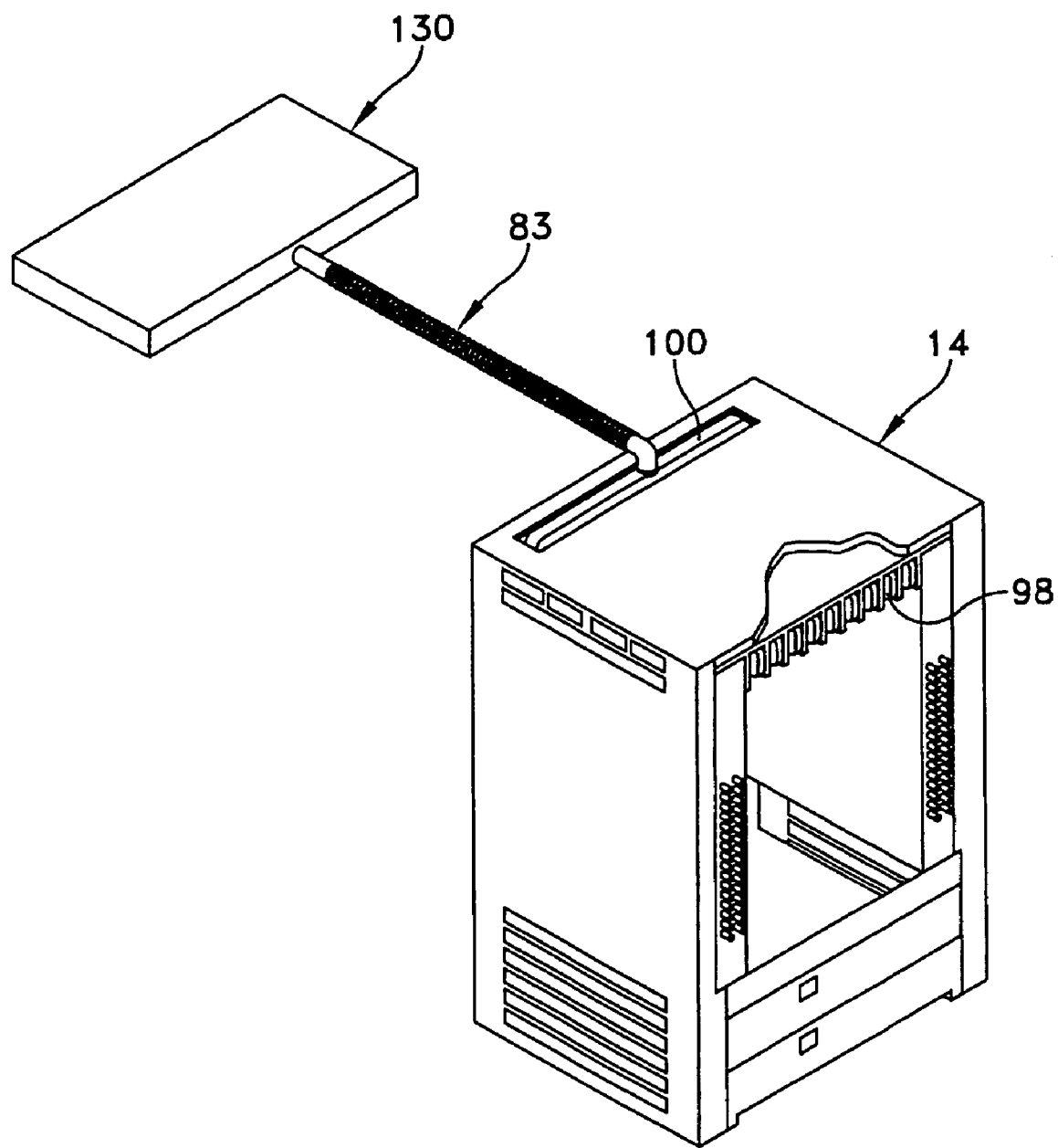
FIG. 13 is a perspective view of a typical electronic system having the evaporator blade and liquid cooled heat exchanger shown in FIG. 11, assembled therein.
Figure 14:
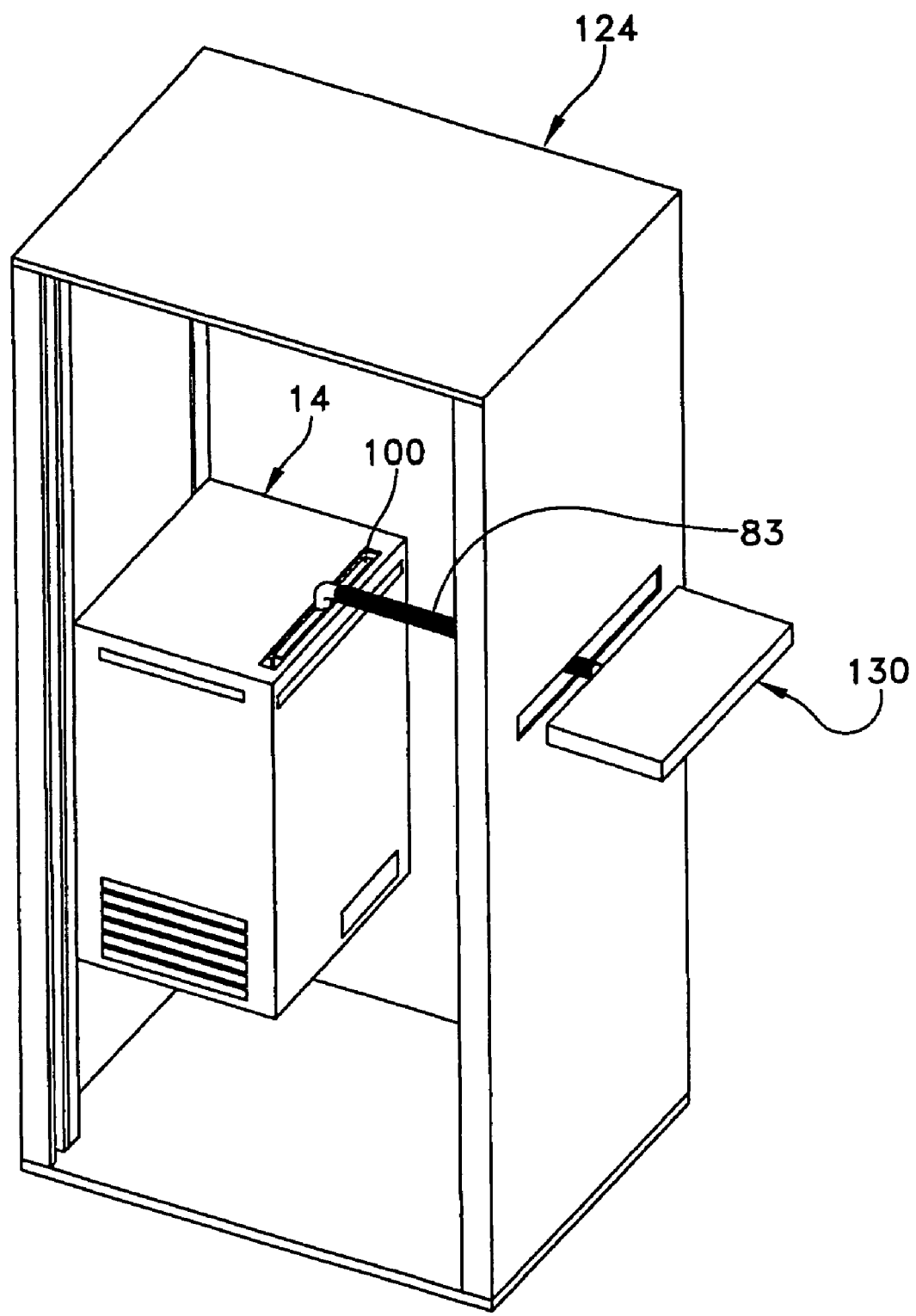
FIG. 14 is a perspective view of the electronic cabinet and thermal management system shown in FIG. 12, housed within a larger enclosure.
Figure 15:
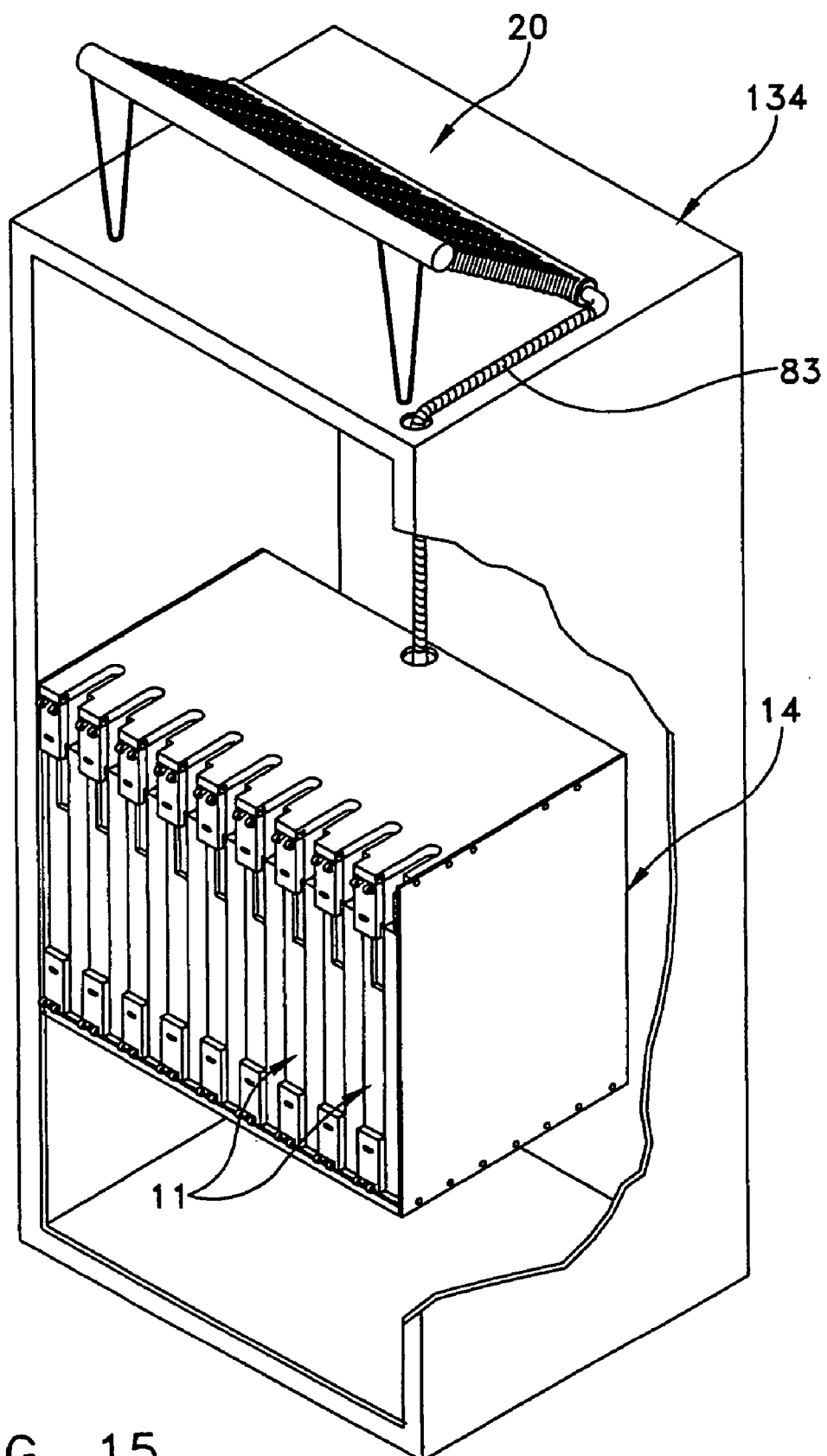
FIG. 15 is a further embodiment of the thermal management system of the present invention having a rack-level cooling assembly disposed on the top surface of an enclosure, more than one hundred centimeters from the remainder of the thermal management system.
Figure 16:
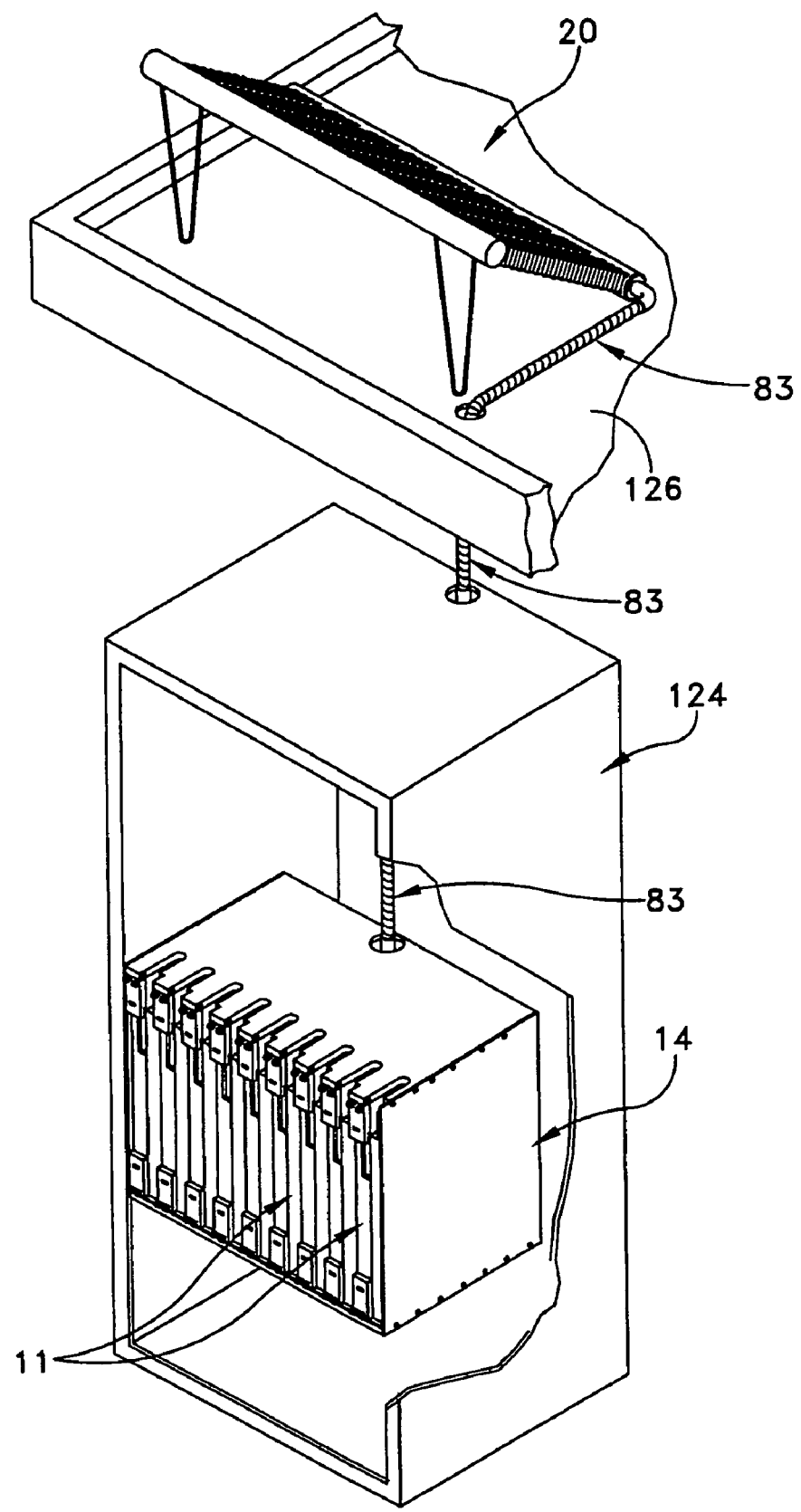
FIG. 16 is a perspective view, similar to FIG. 15, but with the rack-level cooling assembly positioned on the roof of a building.

Coaxial coolant conduit 83 comprises a structure that is capable of transferring coolant fluid and vapor between evaporator 82 and condenser 84 with out leakage to the ambient environment (FIG. 12). In one embodiment, coaxial coolant conduit 83 comprises an outer tube 85 and an inner tube 86, with inner tube 86 positioned concentrically within outer tube 85. As a result of this structural arrangement of tubes, an annular vapor transport space 81 is defined between inner tube 85 and outer tube 86. Outer tube 85 comprises a first open end 87, a second open end 88, and a pleated wall 91 that is formed by a plurality of circumferentially defined creases or folds 93 that are arranged along the length of pleated wall 91 in parallel spaced relation to one another (FIGS. 8, 9, and 12). This pleated wall structure allows outer tube 85 to be bent or formed in a variety of shapes. The flexibility and coaxial nature of outer tube 85 and inner tube 86 permits a high degree of relative motion of coaxial coolant conduit 83 between evaporator 82 and condenser 84. Outer tube 85 is most often formed of an engineering material that is suitable for hermetic sealing to both evaporator 82 and condenser 84, e.g., steel or its alloys, copper or its alloys, or the like. First open end 87 and second open end 88 are formed so as to allow for hermetic sealing, e.g., welding, brazing, or the like to inlet/outlet opening 94 of evaporator 82 and inlet/outlet assembly of condenser 84, respectively.

Inner tube 86 comprises a first open end 97, a second open end 99, and a flexible wall 101 extending therebetween. Inner tube 86 is often formed from a polymer material that is suitable for elevated temperature operation. For example, inner tube 86 may be formed from one of the many fluoropolymers which are substantially free of hydrogen, especially melt-processable copolymers of tetrafluoroethylene with suitable comonomers, such as hexafluoropropylene and perfluoroalkoxyalkenes. Suitable commercially available copolymers include those sold by E. I. Dupont de Nemours under the trade names Teflon FEP and Teflon PFA. The portion or edge of wall 101 adjacent to first open end 97 and second open end 99 are sized and shaped to allow for fluid flow coupling to complementary structures on both evaporator 82 and condenser 84. Significantly, there is no need for hermetic seals to be formed between inner tube 86 and these structures since they all lie within outer tube 85 and any leakage from inner tube 86 into annular vapor transport space 81 would be inconsequential. Inner tube 86 need only be chemically compatible with the condensate coolant fluid. As a consequence, leakage from inner tube 86 will not affect the operation of loop thermosyphon 80.

Condenser 84 comprises a vapor header 110, a liquid header 112, a plurality of conduits 114, and a plurality of fins 116, all formed from a suitably thermally conductive material. A vapor inlet passageway 117 within a conduit 114 extends in fluid communication between a vapor plenum 118 and vapor header 110. Liquid header 112 is arranged in fluid flow communication with plurality of conduits 114, and includes an outlet nipple 122. Outlet nipple 122 is arranged in flow communication with evaporator 82, via an interference fit with second open end 99 of inner tube 86. Inlet passageway 117 of conduit 114 is arranged in flow communication with evaporator 82, via annular vapor transport space 81 defined between inner tube 85 and outer tube 86. Plurality of conduits 114 often comprise hollow, rectangular tubes that are arranged in spaced, parallel relation to one another, and in flow communication between vapor header 110 and liquid header 112. Plurality of fins 116 are positioned between adjacent conduits 114 so as to increase the available thermal conductor surface area and thereby enhance the transfer of thermal energy from vaporous and liquid coolant flowing between vapor vessel 110 and liquid vessel 112 under the force of gravity.

Figure 10:
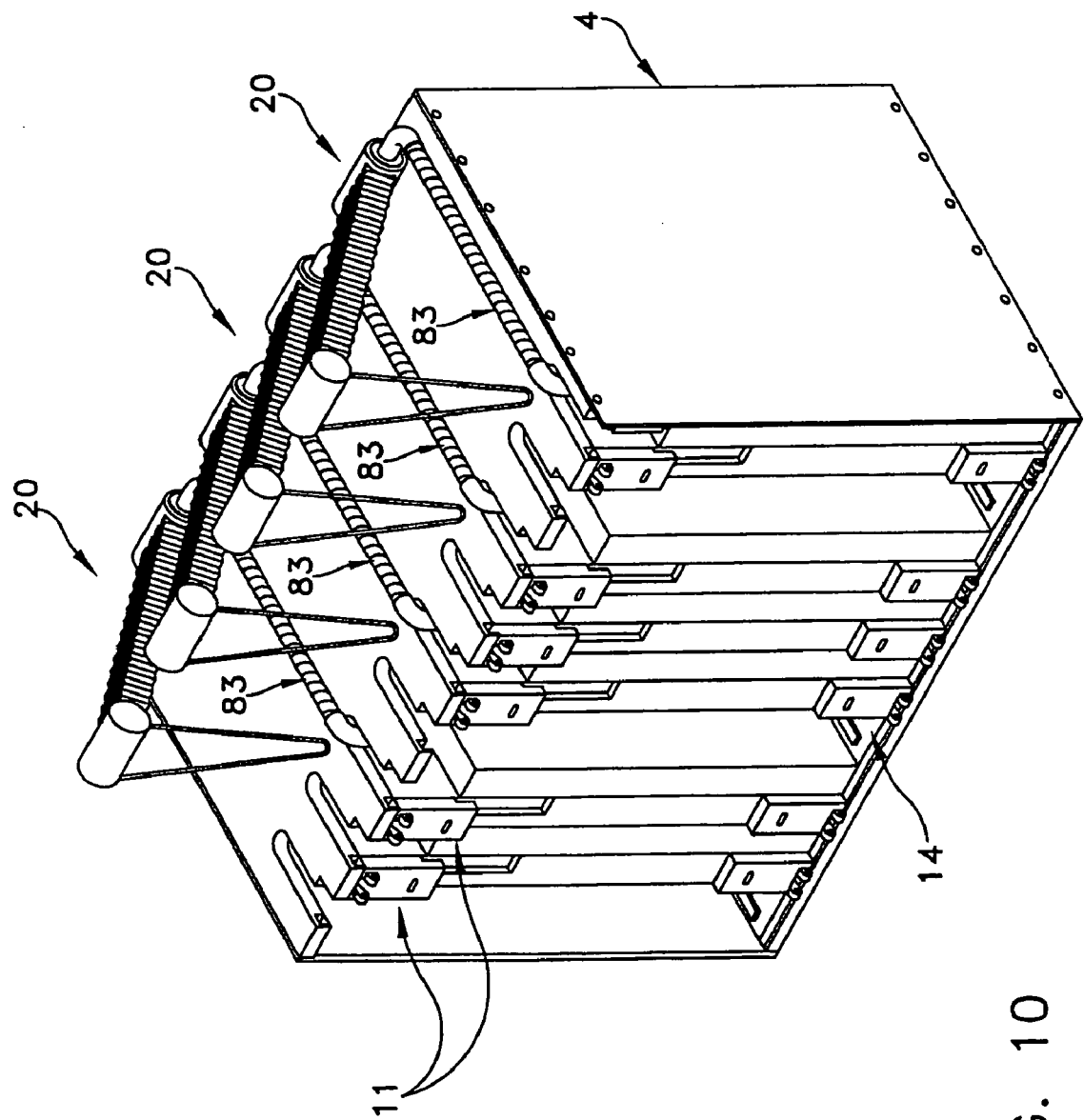
FIG. 10 is a perspective view of an electronic system that is partially populated with a plurality of modular thermal management systems formed in accordance with the present invention.

Condenser 84 acts as a heat exchanger transferring heat contained in a mixture of vaporous coolant fluid and liquid coolant fluid to the ambient environment via convection. If sufficient space is available immediately above the rack containing card shells 11, then a modular system incorporating air cooled heat sinks such as condenser 84 are preferred (FIGS. 1 and 10). Condenser 84 may be located inside or outside of a cabinet or enclosure 124. If the heat is to be transferred to air, external locations that are spaced far away, i.e., by more than one hundred centimeters, allow the use of very large condensers 84 on, e.g., the roof 126 of a building, so heat may be efficiently dumped to the ambient air (FIGS. 13–16).

In many applications, rack housing 14 is not fully filled with card shells 11 at initial installation. A rack housing 14 which accommodates, e.g., nine card shells, may be initially delivered with only three. The modularity of rack-level cooling assembly 20 permits individual installation so the initial number of loop thermosyphons matches the number of card shells 11. Additional loop thermosyphons 80 can be plugged in at any time when additional card shells 11 are added to rack housing 14.

Figure 19:
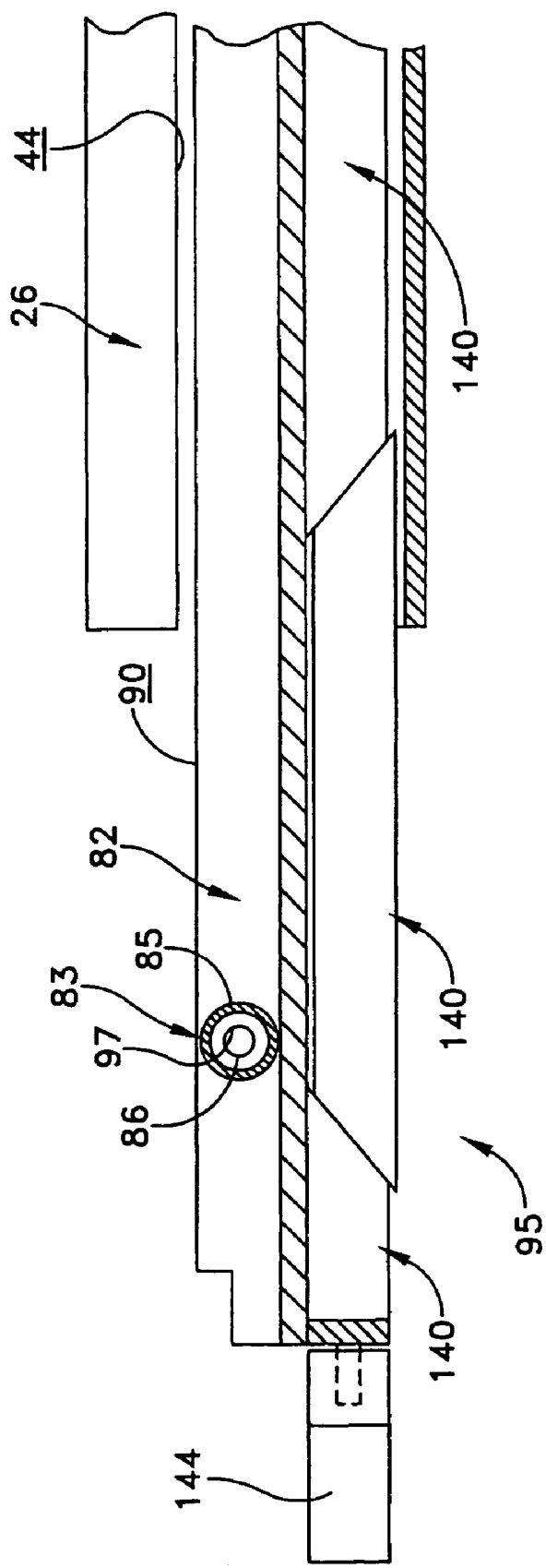
FIG. 19 is a broken-away, top elevational view of the present invention showing the first stage in the process of clamping a rack-level cooling assembly evaporator against a thermal connector portion of a card shell in accordance with the present invention.
Figure 20:
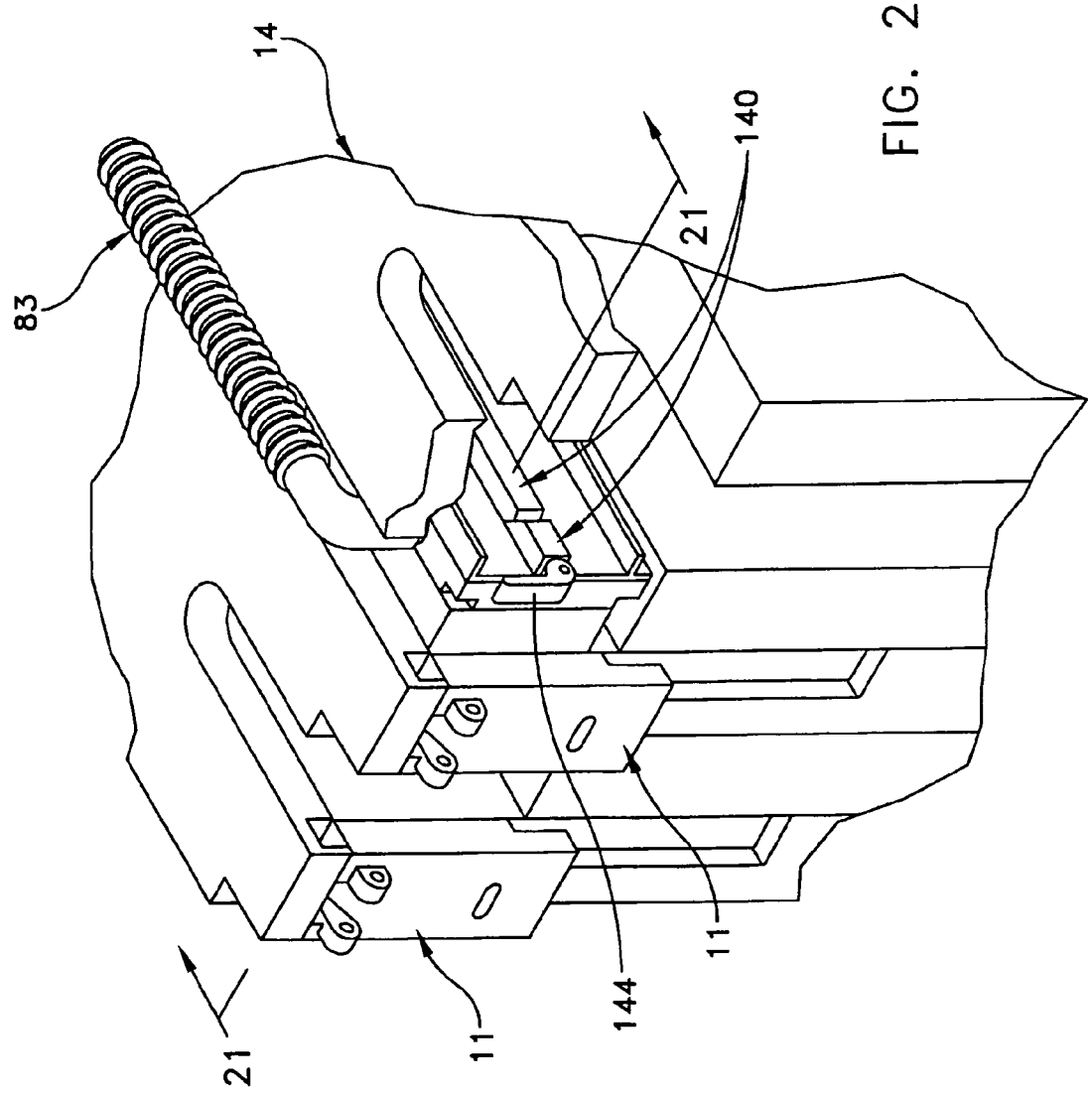
FIG. 20 is a broken-away perspective view of portions of a rack-level cooling assembly and clamping mechanism arranged in accordance with the present invention just after full insertion into a rack housing.
Figure 21:
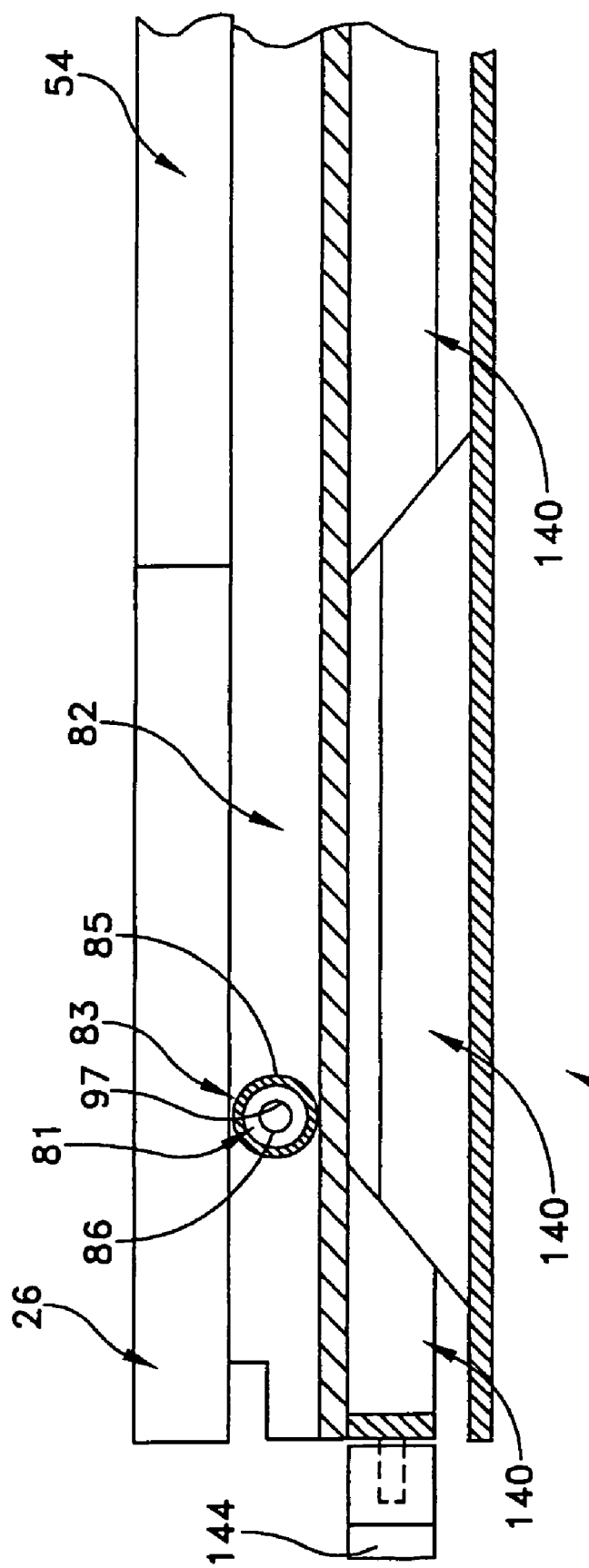
FIG. 21 is a broken-away, top elevational view of the present invention showing the final stage in the process of clamping a rack-level cooling assembly evaporator against a thermal connector portion and thermosyphon condenser portion of a card shell in accordance with the present invention.

Rack-level cooling assembly 20 may be thermally, but releasably engaged with first card-level cooling assembly 16 and second card-level cooling assembly 18 by thermal engagement clamp assembly 95 (FIGS. 9 and 17). More particularly, thermal engagement clamp assembly 95 often comprises a wedge-lock type of clamp, e.g. the "card-lok" clamp manufactured by Calmark Corp of San Gabriel Calif., and disclosed in U.S. Pat. Nos. 5,224,016 and 4,819,713, which patents are hereby incorporated herein by reference. Typically thermal engagement clamp assembly 95 includes a plurality of trapazoidally shaped wedge members 140 that are arranged in an end to end fashion with successive wedge members being oppositely oriented. When wedge members 140 are compressed by the action of a lever 144 upon an internal shaft mechanism (not shown), wedge members 140 slide along their oppositely oriented faces. As this happens, thermal engagement clamp assembly 95 expands laterally so as to exert a lateral clamping force upon the side of evaporator 82 that is opposite third thermal transfer interface surface 90 (FIGS. 18 and 19). In this way, evaporator 82 is driven laterally toward an adjacent card shell 11 so that third thermal transfer interface surface 90 engages first thermal transfer interface surface 44 and second thermal transfer interface surface 69 in intimate thermal communication (FIGS. 20 and 21). A reasonable clamping pressure is essential to providing good thermal connections, but clamping must not be allowed to interfere with the insertion of a card shell 11, or with the making of electrical connections when the card is inserted. Releasing lever 144 removes the force holding wedges 140, thereby providing clearance for zero-interference removal of card shell 11.

It will also be understood that the location above rack of loop thermosyphon 80 allows a more efficient air flow than could be forced through the constricted space between card shells 11, and also permits the use of fin stacks (heat exchangers) that are much larger than could be mounted on or near the components being cooled. However, with the growing power levels being encountered in electronics cooling, heat will more typically be transferred to a liquid cooled heat sink. In an alternative embodiment, a conventional liquid cooled condenser 130 may be used when an air cooled condenser cannot be easily mounted on or near to electronic system 4, or will not have the capacity to handle the thermal energy transferred to it. Liquid cooled condenser 130 can utilize a circulating coolant, such as water or water/ethyleneglycol, or can be the chiller circuit of an HVAC system. Liquid cooled condensers 130 can also be very compact, and would generally be mounted to the outside of the cabinet housing electronics system 4, so that coolant is never introduced into the electronic rack housing 14. Such systems are often sized to dissipate about five kilowatts or so. With this embodiment of the invention, the cabinet can be hermetically sealed to avoid contamination by dust and dirt.

A compact liquid cooled condenser 130, combined with flexible sections 107 in the liquid and vapor lines allows a rack/chassis incorporating a thermal management system 2 to be modularly installed in an existing rack cabinet 14. The only physical change to the cabinet, other than mounting provisions, is cutting a slot in the rear panel of the cabinet.

It is to be understood that the present invention is by no means limited only to the particular constructions herein disclosed and shown in the drawings, but also comprises any modifications or equivalents within the scope of the claims.

What is claimed is:

1. A loop thermosyphon comprising an evaporator and a condenser that are interconnected in flow communication to one another by one conduit comprising a pair of concentrically arranged tubes comprising an inner tube and an outer tube that together define an annular void forming a vapor transfer space that is arranged in flow communication with said evaporator and said condenser, wherein said inner tube is operatively connected by an interference fit to a nipple located on said evaporator and said condenser and said outer tube is operatively connected to said evaporator and said condenser by a hermetic interface.

2. A loon thermosyphon according to claim 1 wherein said evaporator portion comprises a plurality of blade-evaporators that extend from a common manifold, wherein said common manifold is arranged in flow communication with each blade-evaporator and with said one conduit.

3. A loop thermosyphon according to claim 2 wherein each blade-evaporator is joined to said common manifold so that vapor exits from each blade-evaporator to said common manifold and condensate is returned to said common manifold so as to be distributed to individual blade-evaporators.

4. A loop thermosyphon according to claim 3 further comprising a vapor conduit hermetically engaged with said vapor plenum.

5. A loop thermosyphon according to claim 4 further comprising a condensate conduit in flow communication with said liquid header.

6. A loop thermosyphon according to claim 5 wherein said condensate conduit forms an interference fit with said nipple.

7. A thermal bus arranged within an electronics system for transporting thermal energy in a directed manner comprising at least one loop thermosyphon comprising an evaporator and a condenser that are interconnected in flow communication to one another by one conduit comprising a pair of concentrically arranged tubes comprising an inner tube and an outer tube that together define an annular void forming a vapor transfer space that is arranged in flow communication with said evaporator and said condenser, wherein said inner tube is operatively connected by an interference fit to a nipple located on said evaporator and said condenser and said outer tube is operatively connected to said evaporator and said condenser by a hermetic interface.

8. A thermal bus according to claim 7 wherein said inner tube comprises a melt-processable copolymer.

9. A thermal bus according to claim 8 wherein said condenser portion comprises a vapor vessel and a liquid vessel.

10. A thermal bus according to claim 9 wherein said liquid vessel comprises a liquid header and a vapor plenum that are separated by a bulkhead.

11. A thermal bus according to claim 10 wherein said vapor plenum is in flow communication with said vapor vessel.

12. A thermal bus according to claim 10 further comprising a port that passes through said bulkhead.

13. A thermal bus according to claim 10 wherein said inner tube forms said interference fit with said port.

14. A thermal bus according to claim 10 wherein said port comprises said nipple.

15. A thermal bus arranged within an electronics system for transporting thermal energy in a directed manner comprising:

an evaporator and a condenser arranged in flow communication with one another through a conduit comprising an outer tube and an inner tube that are positioned in concentric relation to one another comprising an inner tube and an outer tube that together define an annular void forming a vapor transfer space that is arranged in flow communication with said evaporator and said condenser, wherein said inner tube is operatively connected to a port located on said evaporator and said condenser and said outer tube is operatively connected to said evaporator and said condenser by a hermetic interface.

16. A thermal bus according to claim 15 wherein said evaporator and condenser are spaced apart and separated by at least one structure.

17. A thermal bus according to claim 15 wherein said outer tube comprises a pleated wall that is formed by a plurality of circumferential folds that are arranged in parallel spaced relation to one another.

18. A thermal bus according to claim 15 wherein said inner tube comprises at least one of Teflon FEP and Teflon PFA.

* * * * *